(12) United States Patent
Zhang et al.

(10) Patent No.: US 11,631,742 B2
(45) Date of Patent: Apr. 18, 2023

(54) SEMICONDUCTOR STRUCTURE AND METHOD FOR FORMING SAME

(71) Applicants: Semiconductor Manufacturing International (Shanghai) Corporation, Shanghai (CN); Semiconductor Manufacturing International (Beijing) Corporation, Beijing (CN)

(72) Inventors: Eric Zhang, Shanghai (CN); Lily Liu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 39 days.

(21) Appl. No.: 17/229,183

(22) Filed: Apr. 13, 2021

(65) Prior Publication Data

US 2022/0059664 A1    Feb. 24, 2022

(30) Foreign Application Priority Data

Aug. 21, 2020 (CN) .......................... 202010849880.5

(51) Int. Cl.
*H01L 29/40* (2006.01)
*H01L 29/66* (2006.01)
*H01L 29/78* (2006.01)
*H01L 29/06* (2006.01)

(52) U.S. Cl.
CPC ........ *H01L 29/407* (2013.01); *H01L 29/0653* (2013.01); *H01L 29/401* (2013.01); *H01L 29/66681* (2013.01); *H01L 29/7816* (2013.01)

(58) Field of Classification Search
CPC ..... H01L 29/06; H01L 29/0653; H01L 29/40; H01L 29/401; H01L 29/407; H01L 29/66; H01L 29/66681; H01L 29/78; H01L 29/7816
USPC ........................................ 257/335
See application file for complete search history.

(56) References Cited

U.S. PATENT DOCUMENTS

| | | | | |
|---|---|---|---|---|
| 2009/0140343 A1* | 6/2009 | Feilchenfeld | ..... | H01L 29/66689 257/E29.256 |
| 2009/0283825 A1* | 11/2009 | Wang | ................ | H01L 29/66659 257/E29.256 |
| 2021/0287994 A1* | 9/2021 | Hsueh | ............... | H01L 21/76832 |

* cited by examiner

*Primary Examiner* — Fazli Erdem
(74) *Attorney, Agent, or Firm* — Crowell & Moring, L.L.P.

(57) ABSTRACT

A semiconductor structure and a method for forming the same are provided in embodiments of the present disclosure. The forming method includes: providing a base; forming a trench in the base, and forming a first dielectric layer on the bottom surface and side walls of the trench; forming a conductor layer, the conductor layer covering the first dielectric layer on the bottom surface of the trench; forming a second dielectric layer in the trench on the conductor layer; and forming a drift region on a side, provided with the trench, of the base. The forming method can improve the breakdown voltage of an LDMOS device and also reduce the Ron of the LDMOS device, thereby improving the performance of the LDMOS device.

20 Claims, 5 Drawing Sheets

SEMICONDUCTOR STRUCTURE AND METHOD FOR FORMING SAME

RELATED APPLICATIONS

The present application claims priority to Chinese Patent Appln. No. 202010849880.5, filed Aug. 21, 2020, the entire disclosure of which is hereby incorporated by reference.

BACKGROUND

Technical Field

Embodiments and implementations of the present disclosure relate to the field of semiconductors, and in particular, to a semiconductor structure and a method for forming the same.

Related Art

A lateral diffusion metal oxide semiconductor (LDMOS) plays an important role in the design and manufacture of integrated circuits. For example, high-voltage laterally diffused metal oxide semiconductors (HVLDMOS) are widely used in driver chips of thin-film transistor liquid crystal displays. Generally, during use, an LDMOS transistor requires a relatively high breakdown voltage between drain and source (BVDS) and a low on-resistance (Ron) to improve the efficiency of devices.

Compared with conventional transistors, an existing LDMOS has distinct advantages in key device characteristics such as gain, linearity, switching performance, heat dissipation performance, and reduction of stages. LDMOSs are better compatible with a CMOS process and are therefore widely used. However, there is still a problem that the BVDS is still relatively low and the Ron is relatively high, and further requirements cannot be met.

Therefore, how to improve the device performance of an LDMOS device has become an urgent technical problem to be solved by a person skilled in the art.

SUMMARY

A technical problem to be addressed in embodiments and implementations of the present disclosure is how to improve the device performance of an LDMOS device.

To address the foregoing problem, one form of the present disclosure provides a method for forming a semiconductor structure, including: providing a base; forming a trench in the base, and forming a first dielectric layer on a bottom surface and side walls of the trench; forming a conductor layer, the conductor layer covering the first dielectric layer on the bottom surface of the trench; forming a second dielectric layer in the trench on the conductor layer; and forming a drift region on a side, provided with the trench, of the base.

In some implementations, the material of the conductor layer is polysilicon.

In some implementations, the thickness of the conductor layer ranges from 10 Å to 30 Å.

In some implementations, the step of the forming a conductor layer includes: forming a conductor material layer, the conductor material layer covering the first dielectric layer on the bottom surface of the trench and an upper surface, formed with no trench, of the base; and removing the conductor material layer on the upper surface, formed with no trench, of the base, and using a remaining conductor material layer as the conductor layer.

In some implementations, the process of the removing the conductor material layer on the upper surface, formed with no trench, of the base includes a chemical mechanical polishing process.

In some implementations, a material of the base is monocrystalline silicon, a material of the first dielectric layer is silicon oxide, and the process of the forming a first dielectric layer includes a thermal oxidation growth process.

In some implementations, a thickness of the first dielectric layer on the bottom surface of the trench ranges from 100 Å to 200 Å.

In some implementations, a material of the second dielectric layer is silicon oxide.

In some implementations, the step of forming a second dielectric layer in the trench on the conductor layer includes: forming a second dielectric material layer in the trench on the conductor layer, an upper surface of the second dielectric material layer being higher than an upper surface of the base; and removing the second dielectric material layer higher than the upper surface of the base, and using the remaining material layer as the second dielectric layer.

In some implementations, the step of forming a trench in the base further includes: forming a first protective layer covering the base; the step of the forming a trench in the base includes: patterning the first protective layer and the base to form the trench; and before the step of the forming a drift region on a side, provided with the trench, of the base, the method further includes: removing the first protective layer.

In some implementations, a material of the first protective layer is silicon nitride.

In some implementations, after providing a base and before forming a first protective layer, the method further includes: forming a second protective layer, the second protective layer covering the base; the step of forming a first protective layer, the first protective layer covering the base includes: forming the first protective layer, the first protective layer covering the second protective layer; the step of the forming a trench in the base includes: patterning the first protective layer, the second protective layer and the base to form the trench; and before the step of the forming a drift region on a side, provided with the trench, of the base, the method further includes: removing the first protective layer and the second protective layer.

In some implementations, a material of the second protective layer is silicon oxide.

In some implementations, the step of the forming a drift region on a side, provided with the trench, of the base includes: doping first-type ions in the side, provided with the trench, of the base to form the drift region.

In some implementations, the method further includes: forming a first deep well layer and a second deep well layer under the base, the second deep well layer being located on the first deep well layer, the first deep well layer being doped with the first-type ions, and the second deep well layer being doped with second-type ions.

In some implementations, forming a first deep well layer and a second deep well layer under the base is performed before the doping first-type ions in the side, provided with the trench, of the base to form the drift region.

In some implementations, the first-type ions are N-type ions, and the second-type ions are P-type ions.

Another form of the present disclosure provides a semiconductor structure, including: a base, the base including a drift region, and forming a trench by the drift region; a first dielectric layer, located in the trench, and covering a bottom surface and side walls of the trench; a conductor layer, located in the trench, and covering the first dielectric layer located on the bottom surface of the trench; and a second dielectric layer, located in the trench, covering the conductor layer, and filling at least a part of the trench.

In some implementations, a material of the conductor layer is polysilicon.

In some implementations, a thickness of the conductor layer ranges from 10 Å to 30 Å.

In some implementations, the material of the first dielectric layer and the material of the second dielectric layer are both silicon oxide.

In some implementations, the thickness of the first dielectric layer between the conductor layer and the bottom surface of the trench ranges from 100 Å to 200 Å.

In some implementations, the drift region is doped with first-type ions, and the semiconductor structure further includes: a first deep well layer, located under the drift region, and doped with the first-type ions; and a second deep well layer, located under the drift region and on the first deep well layer, and doped with second-type ions.

In some implementations, the first-type ions are N-type ions, and the second-type ions are P-type ions.

When compared with the prior art, technical solutions of embodiments and implementations of the present disclosure have at least the following advantages: Embodiments and implementations of the present disclosure provide a method for forming a semiconductor structure, including: forming a first dielectric layer and a conductor layer in a trench of a base, and forming a drift region on a side, provided with the trench, of the base, so as to obtain a semiconductor structure. In the semiconductor structure, the conductor layer and the first dielectric layer located between the conductor layer and the drift region are formed on a side, provided with the drift region, of the semiconductor structure, where the first dielectric layer is disposed between the conductor layer and the underlying drift region. In this case, the base material of the conductor layer and that of the underlying drift region may form a capacitor structure, thereby optimizing the distribution of power lines when the semiconductor structure is conducting, so that when a current is conducted, the power lines in the device move down, to reduce an electric field on the surface of the semiconductor structure and assist depletion of the drift region, thereby improving the withstand voltage of the entire device. When the withstand voltage of the entire device is improved, the Ron of the entire device can be appropriately reduced by increasing a doping degree in the drift region, so as to improve the breakdown voltage of an LDMOS device and reduce the Ron of the LDMOS device, thereby improving the performance of the device.

BRIEF DESCRIPTION OF THE DRAWINGS

To describe the technical solutions in embodiments and implementations of the present disclosure or in the related technology more clearly, the following briefly describes the accompanying drawings for describing embodiments and implementations or the related technology. The accompanying drawings in the following description show embodiments and implementations of the present disclosure, and a person of ordinary skill in the art may still derive other drawings from these accompanying drawings without creative efforts.

Figure 1:
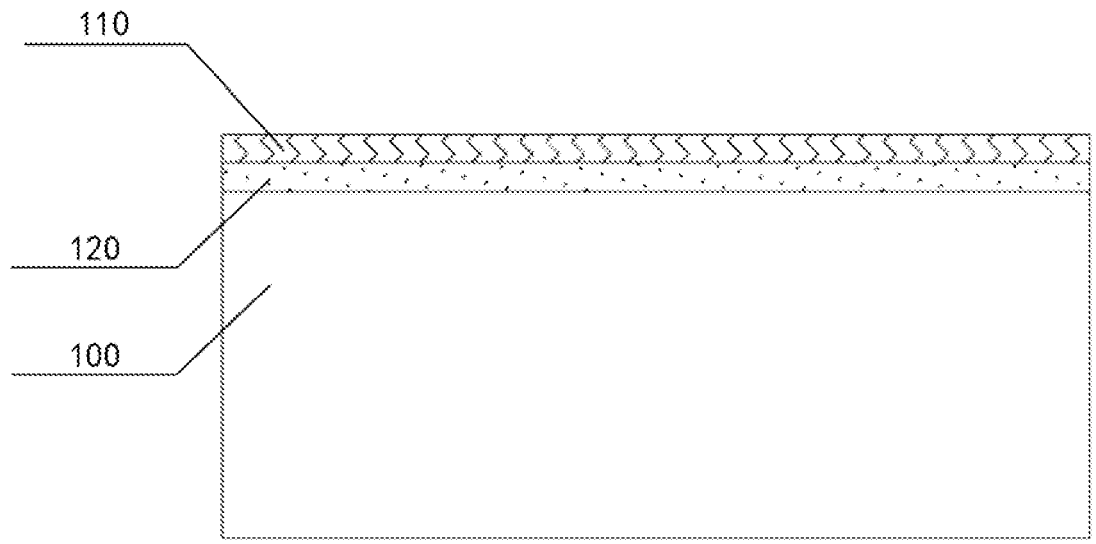
FIG. 1 to FIG. 9 are structural schematic diagrams of steps in one form of a method for forming a semiconductor structure according to the present disclosure.

In the drawings: 100. base; 110. first protective layer; 120. second protective layer; 130. drift region; 140. well region; 150. source region; 160. drain region; 200. trench; 210. first dielectric layer; 220. conductor material layers; 221. conductor layer; 230. second dielectric material layer; 231. second dielectric layer; 310. gate layer; 320. gate dielectric layer; 330. spacer; 410. first deep well layer; and 420. second deep well layer.

DETAILED DESCRIPTION

According to the related art, the performance of existing LDMOS devices is inadequate.

To address the problems described above, a method for forming a semiconductor structure is provided. In one form, a method includes:

providing a base;

forming a trench in the base, and forming a first dielectric layer on a bottom surface and side walls of the trench;

forming a conductor layer, the conductor layer covering the first dielectric layer on the bottom surface of the trench;

forming a second dielectric layer in the trench on the conductor layer; and forming a drift region on a side, provided with the trench, of the base.

In some implementations, a method for forming a semiconductor structure, includes: forming a first dielectric layer and a conductor layer in a trench of a base, and forming a drift region on a side, provided with the trench, of the base, so as to obtain a semiconductor structure, in which the conductor layer and the first dielectric layer located between the conductor layer and the drift region are formed on a side, provided with the drift region, of the semiconductor structure, the first dielectric layer being disposed between the conductor layer and the underlying drift region. In this case, the base material of the conductor layer and that of the underlying drift region may form a capacitor structure, thereby optimizing the distribution of power lines when the semiconductor structure is conducting, so that when a current is conducted, the power lines in the device move down, to reduce an electric field on the surface of the semiconductor structure and assist depletion of the drift region, thereby improving the withstand voltage of the entire device. When the withstand voltage of the entire device is improved, the Ron of the entire device can be appropriately reduced by increasing a doping degree in the drift region, so as to improve the breakdown voltage of an LDMOS device and reduce the Ron of the LDMOS device, thereby improving the performance of the device.

The following describes technical solutions in embodiments and implementations of the present disclosure with reference to the accompanying drawings. The described embodiments and implementations are merely some, rather than all of the embodiments and implementations of the present disclosure. All other embodiments and implementations obtained by a person of ordinary skill in the art based on embodiments and implementations of the present disclosure without creative efforts shall fall within the protection scope of the present disclosure.

FIG. 1 to FIG. 9 are structural schematic diagrams of steps in one form of a method for forming a semiconductor structure according to the present disclosure.

Referring to FIG. 1, a base 100 is provided. The base 100 may provide a processing foundation and a support platform for subsequent processing of a semiconductor structure.

In some implementations, the surface of the base 100 is a plane to facilitate the subsequent processing.

In some implementations, the material of the base 100 is silicon. In other implementations, the material of the base 100 may be alternatively another material such as germanium, silicon-germanium, silicon carbide, gallium arsenide, or indium gallide. The base 100 may be alternatively another type of base such as silicon or germanium on an insulator. The material of the base 100 may be a material that is suitable for a process requirement or may be easily integrated.

During the subsequent processing of the semiconductor structure, it is also necessary to form a conductor material layer on the surface of the base 100 and remove the conductor material layer. To prevent the removal of the conductor layer from damaging the base 100, referring to FIG. 1, the method for forming a semiconductor structure may further include: forming a first protective layer 110, the first protective layer 110 covering the base 100.

The first protective layer 110 may protect the base 100 during the subsequent processing to prevent the base 100 from damage by a subsequent processing process, so that the performance of the formed semiconductor structure is protected from impact.

To improve a protection effect, the material of the first protective layer 110 has high wear resistance. In some implementations, the material of the first protective layer 110 may be silicon nitride. In other implementations, the material of the first protective layer 110 may be aluminum oxide, zirconium oxide or silicon carbide.

Due to the high mechanical strength of silicon nitride, in some implementations, the material of the first protective layer 110 is silicon nitride, so that the underlying covered structure can be adequately protected in the subsequent processing process.

Because the first protective layer 110 is mainly used to protect the base 100 when the conductor material layer is removed, a material with relatively high mechanical strength and relatively high wear resistance is required. In the subsequent processing process, the first protective layer 110 further needs to be removed, and the removal of the first protective layer 110 may still cause damage to the base 100. For this, referring to FIG. 1, in forms of a method for forming a semiconductor structure provided in the present disclosure, a second protective layer 120 may further be formed before the first protective layer 110 is formed, the second protective layer 120 covering the base 100.

In this case, after the second protective layer 120 is formed, the first protective layer 110 is formed on the second protective layer 120.

The second protective layer 120 may protect the base 100 during the removal of the first protective layer 110, so as to prevent the second protective layer 120 from damage caused by the processing process of removing the first protective layer 110 during the removal of the first protective layer 110. Because the material of the first protective layer 110 is different from the material of the conductor layer and a removal process of the first protective layer 110 is different from that of the conductor material layer, the material of the second protective layer 120 does not need to be a material with high mechanical strength, and a material that inflicts slight or basically no damage to the base 100 during the removal of the second protective layer 120 may be selected.

To improve the protection effect, in some implementations, the material of the second protective layer 120 may be silicon oxide. In other implementations, the material of the second protective layer 120 may also be selected as required.

When the second protective layer 120 is silicon oxide and the material of the base 100 is silicon, the second protective layer 120 may be formed using a thermal oxidation growth process or certainly may be formed using a deposition process.

In some implementations, when the first protective layer 110 is silicon nitride, the material of the second protective layer 120 may be silicon oxide, and silicon oxide does not react with a chemical reagent used for removing silicon nitride. In this case, the second protective layer 120 may prevent the base 100 from being corroded by the chemical reagent used for removing silicon nitride during the removal of silicon nitride, and the base 100 can be adequately protected. A process of removing silicon oxide does not damage the base 100, and therefore the removal of the second protective layer 120 does not cause damage to the base 100.

Figure 2:
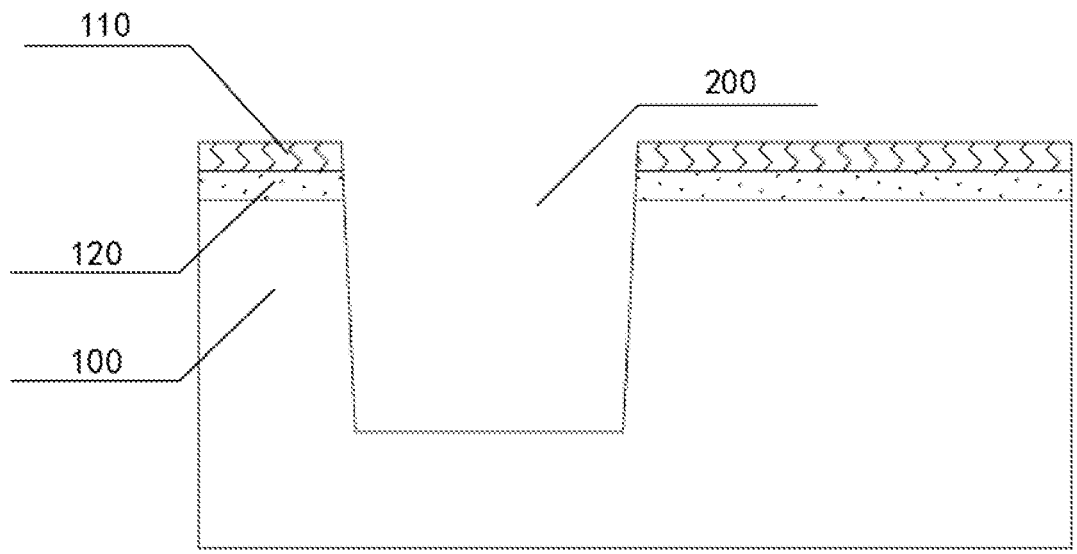

Referring to FIG. 2, a trench 200 is formed in the base 100.

In a subsequent process, a first dielectric layer, a conductor layer, and a second dielectric layer may further be formed in the trench 200.

It can be understood that the trench 200 may be formed in the base 100 by dry etching, wet etching or another method.

In some implementations, when the base 100 is covered with the first protective layer 110 or is covered with both the first protective layer 110 and the second protective layer 120, the first protective layer 110 or the second protective layer 120 may be patterned simultaneously to form the trench 200.

Figure 3:
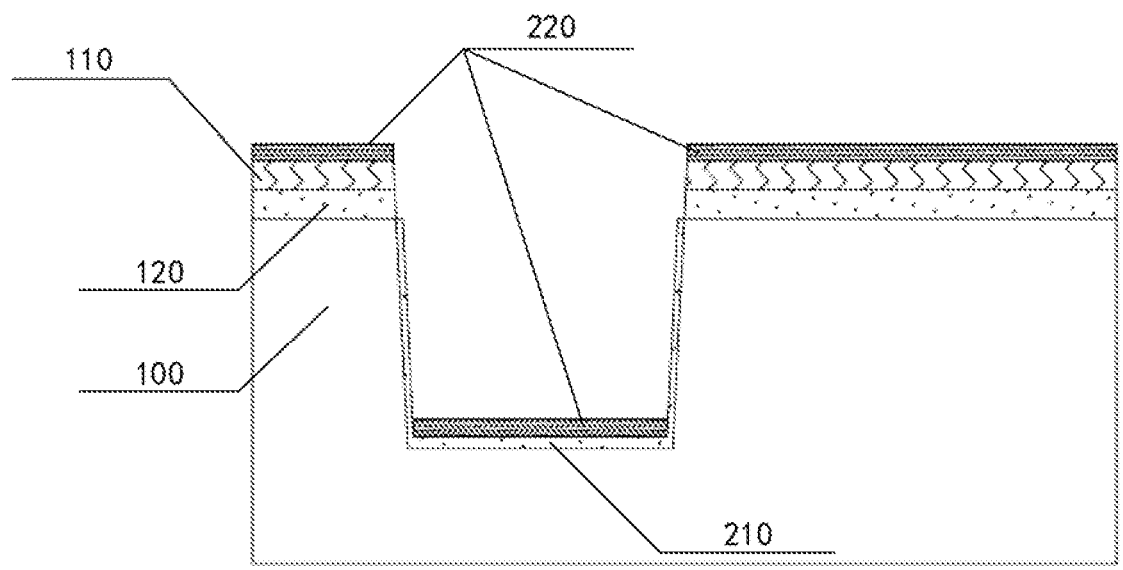

Referring to FIG. 3, a first dielectric layer 210 is formed on the bottom surface and side walls of the trench 200.

The first dielectric layer 210 on the bottom surface of the trench 200 may form a capacitor structure with a subsequently formed conductor layer 221 and a drift region 130 under the trench 200.

The material of the first dielectric layer 210 may be selected as required. In a specific implementation, the material of the first dielectric layer 210 is silicon oxide. When the first dielectric layer 210 is silicon oxide and the material of the base 100 is silicon, the first dielectric layer 210 may be formed by a thermal oxidation growth process. In other implementations, the material of the first dielectric layer 210 may also be selected as required. In other implementations, a first dielectric material layer covering the base 100 may also be removed in subsequent steps, and only the first dielectric material layer remaining on the bottom surface and side walls of the trench 200 is used as the first dielectric layer 210.

When the base 100 is covered with the first protective layer 110, the first dielectric material layer is formed on an upper surface, formed with no trench 200, of the first protective layer 110 and on the bottom surface of the trench 200.

Certainly, the thickness of the first dielectric layer 210 on the bottom surface of the trench 200 may be set as required. However, when the thickness of the first dielectric layer 210 on the bottom surface of the trench 200 is relatively small, it is relatively difficult to form the first dielectric layer 210. When the thickness of the first dielectric layer 210 on the bottom surface of the trench 200 is relatively large, the burial depth of the conductor layer is reduced due to the size restriction of the device, and the effect of the breakdown voltage of the obtained semiconductor structure is inadequate. Therefore, in some implementations, the thickness of the first dielectric layer 210 on the bottom surface of the trench 200 ranges from 100 Å to 200 Å. In this case, a vertical distance between the conductor layer and the drift region is relatively moderate, to adequately enable the conductor layer to assist depletion of the drift region 130 and prevent a breakdown at the conductor layer.

Figure 4:
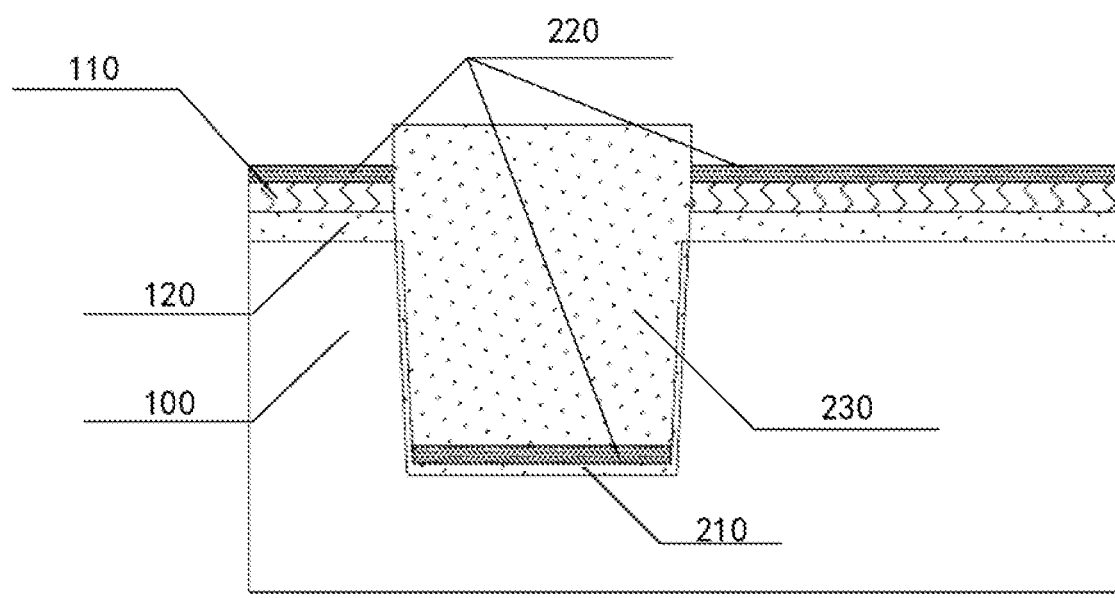

Referring to FIG. 4, a conductor layer is formed, the conductor layer covering the first dielectric layer 210 on the bottom surface of the trench 200.

Certainly, in a specific implementation, to reduce the processing difficulty, a conductor material layer 220 may be formed on the dielectric layer on the bottom surface of the trench 200 and on an upper surface, formed with no trench 200, of the base 100. Next, in subsequent steps, the conductor material layer 220 on the upper surface, formed with no trench 200, of the base 100 is removed, and the remaining conductor material layer 220 is used as the conductor layer 221.

Certainly, in subsequent steps, the conductor material layer 220 on the upper surface, formed with no trench 200, of the base 100 may be removed, and only the conductor material layer 220 of the first dielectric layer 210 covering the bottom surface of the trench 200 is used as the conductor layer 221.

When the base 100 is covered with the first protective layer 110, the conductor material layer 220 is formed on the upper surface, formed with no trench 200, of the first protective layer 110 and on the first dielectric layer 210 on the bottom surface of the trench 200.

Due to a large angle between the side walls of the trench 200 and the bottom surface of the trench 200, during a deposition process, it is difficult for the material of the conductor layer 221 to be deposited on the side walls of the trench 200, and the material of the conductor layer 221 deposited on the side walls of the trench 200 may be ignored.

It can be understood that the material of the conductor layer 221 may be selected as required. In some implementations, the material of the conductor layer 221 is mainly polysilicon. In other implementations, the material of the conductor layer 221 may be alternatively aluminum, aluminum alloy or another conductor.

When the material of the conductor layer 221 is polysilicon, the difficulty of deposition is low, and a processing cost is low.

The first dielectric layer 210 is disposed between the conductor layer 221 and the underlying drift region, and the base material of the conductor layer 221 and that of the underlying drift region 130 may form a capacitor structure, thereby optimizing the distribution of power lines when the semiconductor structure is conducting, so that when a current is conducted, the power lines in the device move down, to reduce an electric field on the surface of the semiconductor structure and reduce a possibility of a surface breakdown. The formed capacitor structure can assist depletion of the drift region. When the drift region is depleted, the breakdown voltage of an obtained semiconductor structure can be increased.

The thickness of the conductor layer 221 may be set as required.

When the thickness of the conductor layer 221 is relatively small, it is relatively difficult to form the conductor layer 221. When the thickness of the conductor layer 221 is relatively large, the burial depth of the conductor layer 221 is reduced due to the size restriction of the device, and the effect of improving the breakdown voltage of the obtained semiconductor structure is inadequate. Therefore, in a specific implementation, the thickness of the conductor layer 221 ranges from 10 Å to 30 Å. In this case, the effect of the breakdown voltage of the obtained semiconductor structure is improved and the difficulty of forming the conductor layer 221 is reduced.

Figure 5:
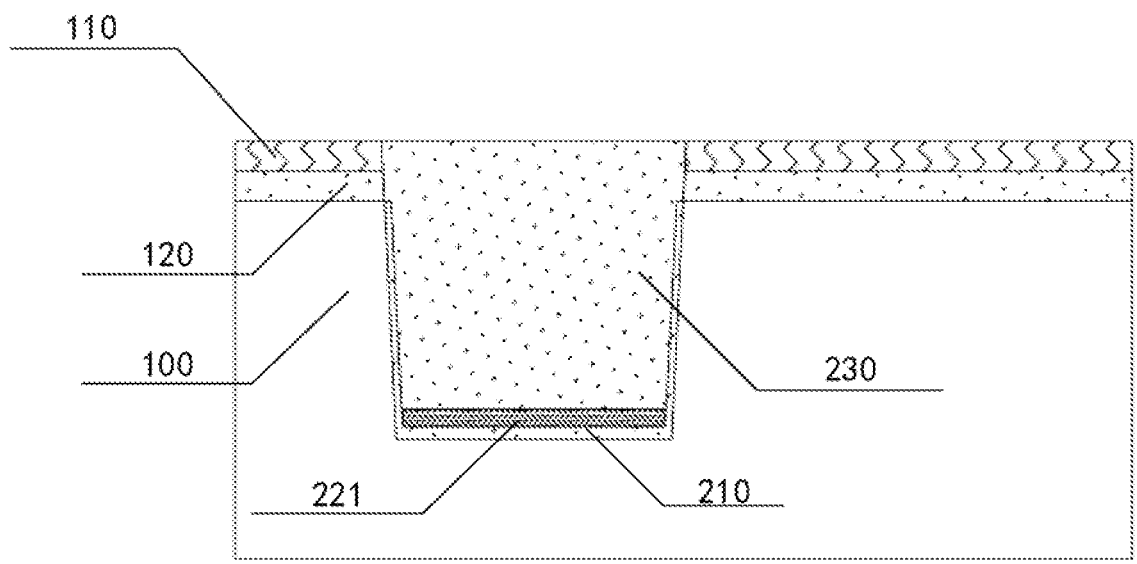

Referring to FIG. 5, after the conductor layer 221 is formed, a second dielectric layer is formed in the trench 200 on the conductor layer 221.

The second dielectric layer covers the conductor layer 221 to implement insulation from the conductor layer 221.

The material of the second dielectric layer may be selected as required. In a specific implementation, the material of the second dielectric layer is silicon oxide. In other implementations, the material of the second dielectric layer may be selected as required. The material of the first dielectric layer 210 and that of the second dielectric layer may be the same or different.

The second dielectric layer may be formed by a deposition process or another processes.

In a specific implementation, the step of the forming a second dielectric layer in the trench 200 on the conductor layer 221 includes:

forming a second dielectric material layer 230 in the trench 200 on the conductor layer 221, an upper surface of the second dielectric material layer 230 being higher than an upper surface of the base 100; and removing the second dielectric material layer 230 higher than the upper surface of the base 100, and using the remaining material layer as the second dielectric layer.

In implementations of the method for forming the second dielectric material layer 230 only in the trench 200 on the conductor layer 221 includes depositing, using a barrier structure, the second dielectric material layer 230 only in the trench 200 on the conductor layer 221.

Certainly, alternatively, the second dielectric material layer 230 may be formed on the conductor material layer 220 covered by a portion, formed with no trench 200, of the base 100, and is then removed.

The removal of the second dielectric material layer 230 higher than the upper surface of the base 100 may be performed simultaneously with subsequent removal of corresponding parts of the conductor layer 221, the first protective layer 110, and the second protective layer 120.

To facilitate the subsequent formation of the structure and provide an adequate support platform for the subsequent formation process, when a structure covering the second dielectric layer is formed, the upper surface of the second dielectric layer may be flush with the upper surface of the base 100.

Figure 6:
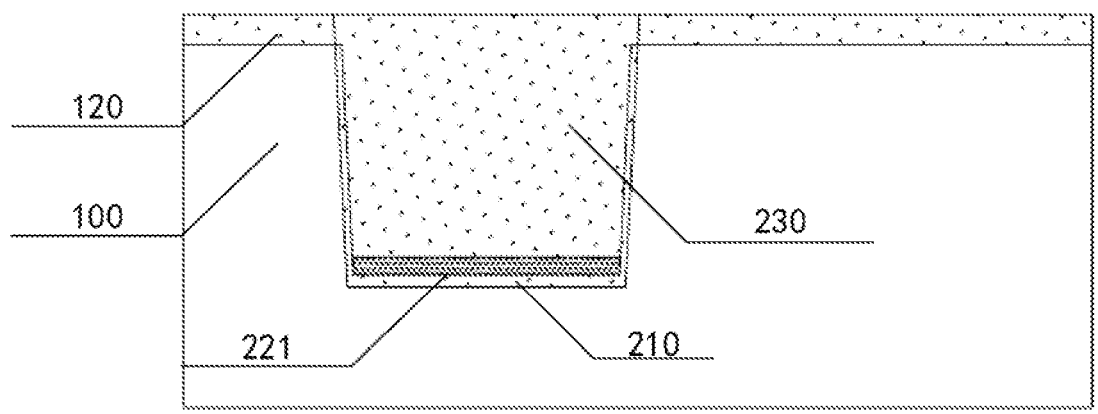

Referring to FIG. 6, in some implementations, after the second dielectric material layer 230 is formed, the conductor material layer 220 on the upper surface, formed with no trench 200, of the base 100 is removed to form the conductor layer 221.

When the material of the conductor material layer 220 is polysilicon, the conductor material layer 220 on the upper surface of the trench 200 may be removed using a chemical mechanical polishing process.

When the second dielectric material layer 230 includes a part above the level of the bottom surface of the conductor layer 221, the conductor layer 221 and the second dielectric material layer 230 including the part above the level of the bottom surface of the conductor layer 221 may be removed simultaneously using a chemical mechanical polishing process.

Because the conductor material layer 220 on the upper surface of the trench 200 may be provided with the first protective layer 110, an underlying structure covered by the first protective layer 110 may be protected during the chemical mechanical polishing process. In a specific implementation, the material of the first protective layer 110 is silicon nitride.

Figure 7:
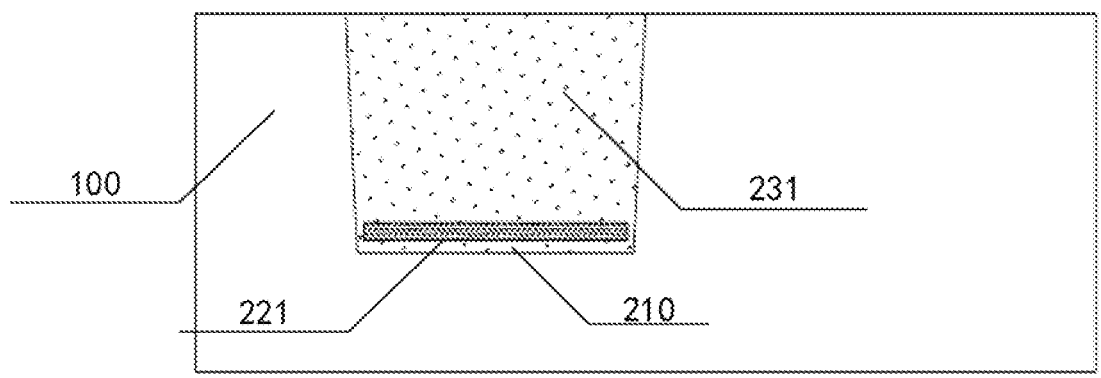

Referring to FIG. 7, the first protective layer 110 is removed.

When the first protective layer 110 is formed on the base 100, the first protective layer 110 needs to be removed after the conductor layer 221 is obtained.

Specifically, in a specific implementation, when the material of the first protective layer 110 is silicon nitride, the first protective layer 110 may be removed using a chemical mechanical polishing process, and a used polishing reagent may contain phosphoric acid.

Referring to FIG. 7, when the second dielectric material layer 230 includes a part above the level of the bottom surface of the first dielectric layer 210, the first dielectric layer 210 and the second dielectric material layer 230 including the part above the level of the bottom surface of the first dielectric layer 210 may be removed simultaneously by using a chemical mechanical polishing process.

Figure 8:
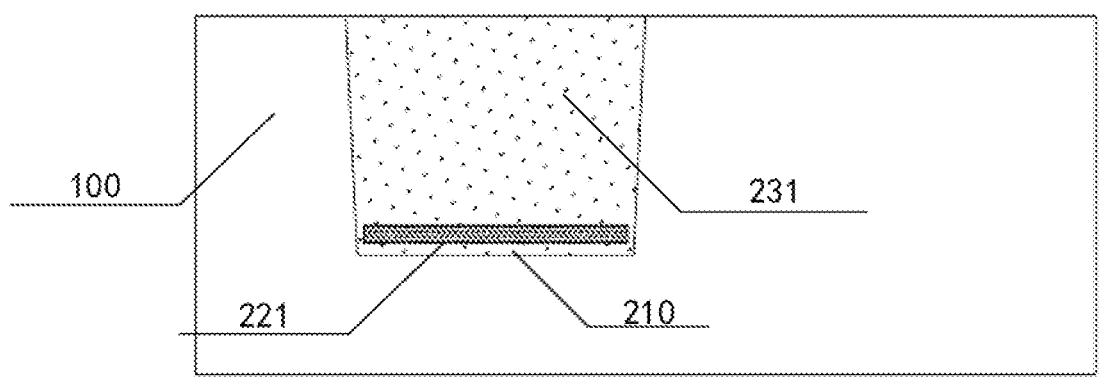

Referring to FIG. 8, the second protective layer 120 is removed.

As mentioned above, to prevent phosphoric acid from corroding the base 100 under the first protective layer 110, the second protective layer 120 may be disposed between the first protective layer 110 and the base 100.

In some implementations, the material of the second protective layer 120 is silicon oxide. Because the material of the second protective layer 120 is silicon oxide that does not react with phosphoric acid, the base 100 may be protected from being corroded by phosphoric acid.

When the second protective layer 120 is disposed between the first protective layer 110 and the base 100, the second protective layer 120 needs to be removed for the subsequent formation of the structure.

When the material of the second protective layer 120 is silicon oxide, the second protective layer 120 may be removed using a chemical mechanical polishing process, and the used polishing reagent may contain hydrofluoric acid.

Referring to FIG. 8, when the second dielectric material layer 230 includes a part above the level of the bottom surface of the second protective layer 120, the second protective layer 120 and the second dielectric material layer 230 including the part above the level of the bottom surface of the second protective layer 120 may be removed simultaneously using a chemical mechanical polishing process.

Figure 9:
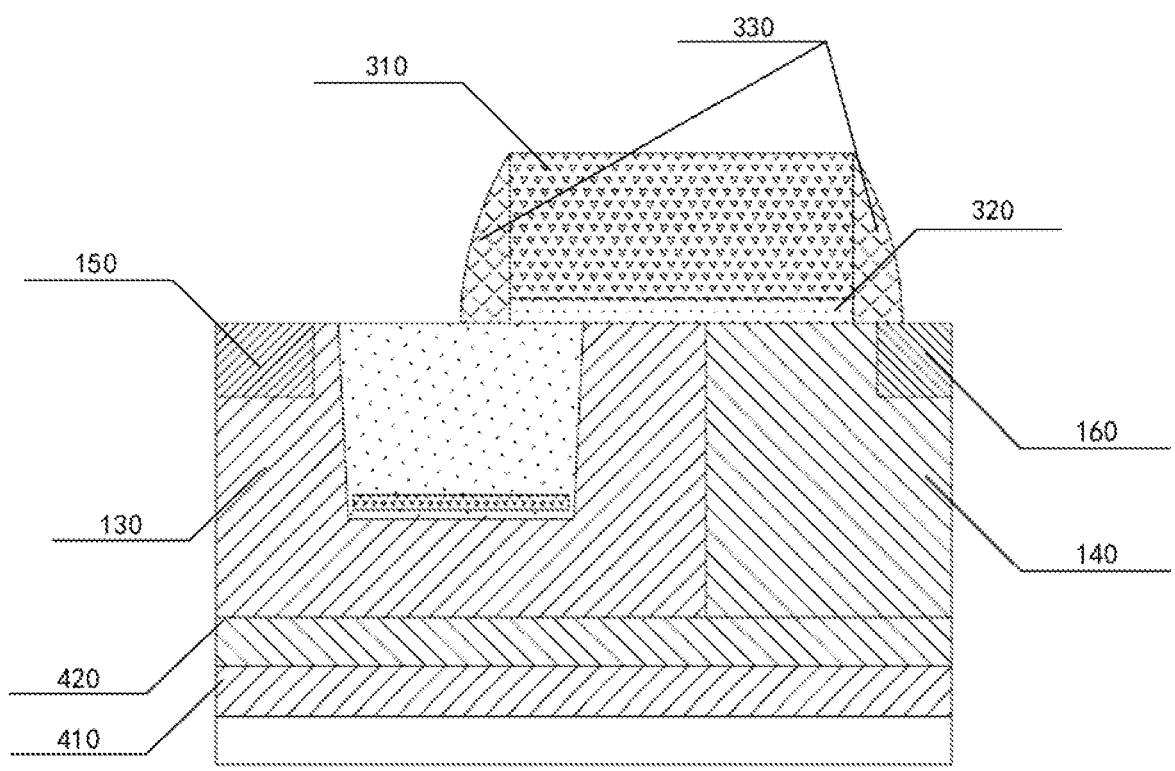

Referring to FIG. 9, a drift region 130 is formed on the side, provided with the trench, of the base 100, the drift region 130 being doped with the first-type ions.

The drift region 130 may be formed by ion implantation.

Therefore, the material of the conductor layer 221 and that of the base 100 of the underlying drift region 130 may form a capacitor structure, thereby optimizing the distribution of power lines when the semiconductor structure is conducting, so that when a current is conducted, the power lines in the device move down, to reduce an electric field on the surface of the semiconductor structure and assist depletion of the drift region 130, thereby improving the withstand voltage of the entire device. When the withstand voltage of the entire device is improved, the Ron of the entire device can be appropriately reduced by increasing a doping degree in the drift region 130, so as to improve the breakdown voltage of an LDMOS device and reduce the Ron of the LDMOS device, thereby improving the performance of the device.

Referring to FIG. 9, a first deep well layer 410 and a second deep well layer 420 may further be formed under the drift region 130. The second deep well layer 420 is located on the first deep well layer 410 and under the drift region 130. The first deep well layer 410 is doped with the first-type ions, and the second deep well layer 420 is doped with second-type ions.

The first deep well layer 410 and the second deep well layer 420 may be formed by ion implantation at the lower part of the base 100.

Alternatively, the ion implantation may be performed on different substrates of the base 100, and the base 100 is then bonded to the first deep well layer 410 and the second deep well layer 420.

In addition, the ion doping in the drift region 130 and the forming of the first deep well layer 410 and the second deep well layer 420 do not happen in a fixed sequence.

When the first deep well layer 410, the second deep well layer 420 and the drift region 130 are formed by ion implantation at the lower part of the base 100, in a specific implementation, the first deep well layer 410 may be formed before the second deep well layer 420 is formed. If the second deep well layer 420 is formed before the first deep well layer 410 is formed, ion implantation destroys a crystal form in the second deep well layer 420. When the first deep well layer 410 is then formed, it is difficult to perform ion implantation, and it is difficult for ions to enter a required position, resulting in relatively low purity of doped ions in an obtained structure. If the first deep well layer 410 is formed before the second deep well layer 420 is formed, the foregoing problem can be avoided.

Similarly, the drift region 130 may be formed after the first deep well layer 410 and the second deep well layer 420 are formed. Compared with a method in which the drift region 130 is formed before the first deep well layer 410 and the second deep well layer 420 are formed, this method has lower processing difficulty and higher purity of doped ions in the obtained structure.

Because the first deep well layer 410 and the second deep well layer 420 are located under the drift region 130, the second deep well layer 420 is located on the first deep well layer 410, the type of ions doped in the first deep well layer 410 is the same as that in the drift region 130, and the type of ions doped in the second deep well layer 420 is opposite to that in the drift region 130 and the first deep well layer 410, a longitudinal junction formed by the first deep well layer 410 and the second deep well layer 420 can assist the formation of a longitudinal junction between the second deep well layer 420 and the drift region 130, thereby assisting further depletion of the drift region 130 to further increase the breakdown voltage of the obtained semiconductor structure.

To facilitate processing and improve the performance of an obtained semiconductor structure, in a specific implementation, the first-type ions are N-type ions, the N-type ions including at least one of phosphorus ions, arsenic ions, and antimony ions, or the second-type ions are P-type ions, the P-type ions including at least one of boron ions, gallium ions, or indium ions. When the first-type ions are N-type ions and the second-type ions are P-type ions, the semiconductor structure has better noise performance, lower processing difficulty, and a lower cost.

Certainly, in another specific implementation, the first-type ions may be P-type ions and the second-type ions may be N-type ions.

Certainly, the semiconductor device may also include a well region 140, a source region 150, a drain region 160, and a gate structure. The well region 140 is located on the other side of the drift region 130 of the base 100, the source region 150 is located on a side, farther away from the well region 140 than the trench 200, of the drift region 130, and the drain region 160 is located on a side, far away from the drift region 130, of the well region 140. The gate structure includes a gate dielectric layer 320, a gate layer 310 located on the gate dielectric layer 320, and spacers 330 covering the gate dielectric layer 320 and the side walls of the gate layer 310. The spacers 330 are located respectively on two opposite side walls of the gate dielectric layer 320 and the gate layer 310. In the process of the forming the semiconductor structure, the spacers 330 protect the side walls of the gate dielectric layer 320 and the gate layer 310, and the spacers 330 are also used for defining a forming region of the source region 150. In some implementations, the material of the gate dielectric layer 320 is silicon oxide, and the gate layer 310 is polysilicon. In other implementations, the material of the gate dielectric layer 320 may be silicon nitride, silicon oxynitride, silicon oxycarbide, or a high-k gate dielectric material. The gate layer 310 may also be a metal gate material such as Al, Cu, Ag, Au, Pt, Ni, Ti, Co or W. In some implementations, the material of the spacer 330 is silicon oxide. In other implementations, the material of the spacer 330 may be at least one of silicon oxide, silicon nitride, silicon carbide, silicon carbonitride, silicon oxycarbonitride, silicon oxynitride, boron nitride, or boron carbonitride. Certainly, the well region 140, the source region 150, the drain region 160, and the gate structure may be selected as required, and other structures may also be included.

In this case, in implementations of a method for forming a semiconductor structure provided in the present disclosure, a conductor layer 221 is formed in the trench 200 on the side of the drift region 130 in an obtained semiconductor structure, and the first dielectric layer 210 and the second dielectric layer 231 are formed around the conductor layer 221, the first dielectric layer 210 may be disposed between the conductor layer 221 and the underlying drift region 130. In this case, the material of the conductor layer 221 and that of the base 100 of the underlying drift region 130 may form a capacitor structure, thereby optimizing the distribution of power lines when the semiconductor structure is conducting, so that when a current is conducted, the power lines in the device move down, to reduce an electric field on the surface of the semiconductor structure and assist depletion of the drift region 130, thereby improving the withstand voltage of the entire device. When the withstand voltage of the entire device is improved, the Ron of the entire device can be appropriately reduced by increasing a doping degree in the drift region 130, so as to improve the breakdown voltage of an LDMOS device and reduce the Ron of the LDMOS device, thereby improving the performance of the device.

Referring to FIG. 9, one form of the present disclosure further provides a semiconductor structure, including:

a base, the base including a drift region 130, and forming a trench in the drift region 130;

a first dielectric layer, located in the trench, and covering the bottom surface and side walls of the trench;

a conductor layer, located in the trench, and covering the first dielectric layer located on the bottom surface of the trench; and a second dielectric layer, located in the trench, covering the conductor layer, and filling at least a part of the trench.

In this case, in implementations of a semiconductor structure provided in the present disclosure, a conductor layer is formed on the side of the drift region 130, and a first dielectric layer is formed between the conductor layer and the drift region 130, the first dielectric layer being disposed between the conductor layer and the underlying drift region 130. In this case, the base material of the conductor layer and that of the underlying drift region 130 may form a capacitor structure, thereby optimizing the distribution of power lines when the semiconductor structure is conducting, so that when a current is conducted, the power lines in the device move down, to reduce an electric field on the surface of the semiconductor structure and assist depletion of the drift region 130, thereby improving the withstand voltage of the entire device. When the withstand voltage of the entire device is improved, the Ron of the entire device can be appropriately reduced by increasing a doping degree in the drift region 130, so as to improve the breakdown voltage of an LDMOS device and reduce the Ron of the LDMOS device, thereby improving the performance of the device.

In a specific implementation, the material of the conductor layer is polysilicon. In other implementations, the material of the conductor layer may be alternatively aluminum, aluminum alloy or another conductor. When the material of the conductor layer is polysilicon, the difficulty of deposition is low, and a processing cost is low.

In a specific implementation, the thickness of the conductor layer ranges from 10 Å to 30 Å, which can improve the effect of the breakdown voltage of the obtained semiconductor structure and reduce the difficulty of forming the conductor layer.

In a specific implementation, the material of the first dielectric layer and the material of the second dielectric layer are both silicon oxide. The first dielectric layer on the bottom surface of the trench may form a capacitor structure with a subsequently formed conductor layer and the drift region 130 under the trench. The distribution of power lines may be optimized when the semiconductor structure is conducting, so that when a current is conducted, the power lines in the device move down, to reduce an electric field on the surface of the semiconductor structure and assist depletion of the drift region 130, thereby improving the withstand voltage of the entire device. When the withstand voltage of the entire device is improved, the Ron of the entire device can be appropriately reduced by increasing a doping degree in the drift region 130, so as to improve the breakdown voltage of an LDMOS device and reduce the Ron of the LDMOS device, thereby improving the performance of the device.

In a specific implementation, the thickness of the first dielectric layer 210 between the conductor layer and the bottom surface of the trench ranges from 100 Å to 200 Å. In this case, a vertical distance between the conductor layer and the drift region is relatively moderate, to adequately enable the conductor layer to assist depletion of the drift region 130 and prevent a breakdown at the conductor layer.

In a specific implementation, the drift region 130 is doped with first-type ions, and the semiconductor structure further includes:

a first deep well layer 410, located under the drift region 130, and doped with the first-type ions; and a second deep well layer 420, located between the first deep well layer 410 and the drift region 130, and doped with second-type ions. Because the first deep well layer 410 and the second deep well layer 420 are located under the drift region 130, the second deep well layer 420 is located on the first deep well layer 410, the type of ions doped in the first deep well layer 410 is the same as that in the drift region 130, and the type of ions doped in the second deep well layer 420 is opposite to that in the drift region 130 and the first deep well layer 410, a longitudinal junction formed by the first deep well layer 410 and the second deep well layer 420 can assist the formation of a longitudinal junction between the second deep well layer 420 and the drift region 130, thereby assisting further depletion of the drift region 130 to further increase the breakdown voltage of the obtained semiconductor structure.

In a specific implementation, the first-type ions are N-type ions, and the second-type ions are P-type ions, so that the processing is facilitated and the performance of the obtained semiconductor structure is improved.

The foregoing descriptions of the disclosed embodiments and implementations enable a person skilled in the art to implement or use the present disclosure. Various modifications to these embodiments and implementations are obvious to a person skilled in the art, and the general principles defined in this specification may be implemented in other embodiments and implementations without departing from the spirit or scope of the present disclosure. Therefore, the present disclosure is not limited to these embodiments and implementations illustrated herein, but conforms to the broadest scope consistent with the principles and novel features disclosed in the present disclosure.

Although embodiments and implementations of the present disclosure have been disclosed above, the embodiments and implementations of the present disclosure are not limited thereto. A person skilled in the art may make variations and modifications without departing from the spirit and scope of the embodiments and implementations of the present disclosure. Therefore, the protection scope of the embodiments and implementations of the present disclosure should be subject to the appended claims.

What is claimed is:

1. A method for forming a semiconductor structure, comprising:
   providing a base;
   forming a trench in the base, and forming a first dielectric layer on a bottom surface and side walls of the trench, a thickness of the first dielectric layer on the bottom surface of the trench ranges from 100 Å to 200 Å;
   forming a conductor layer, the conductor layer covering the first dielectric layer on the bottom surface of the trench, a thickness of the conductor layer ranging from 10 Å to 30 Å;
   forming a second dielectric layer in the trench on the conductor layer; and
   forming a drift region on a side, provided with the trench, of the base.

2. The method for forming a semiconductor structure according to claim 1, wherein a material of the conductor layer is polysilicon.

3. The method for forming a semiconductor structure according to claim 1, wherein the step of the forming a conductor layer comprises:
   forming a conductor material layer, the conductor material layer covering the first dielectric layer on the bottom surface of the trench and an upper surface, formed with no trench, of the base; and
   removing the conductor material layer on the upper surface, formed with no trench, of the base, and using a remaining conductor material layer as the conductor layer.

4. The method for forming a semiconductor structure according to claim 3, wherein the process of the removing the conductor material layer on the upper surface, formed with no trench, of the base comprises a chemical mechanical polishing process.

5. The method for forming a semiconductor structure according to claim 1, wherein a material of the base is monocrystalline silicon, a material of the first dielectric layer is silicon oxide, and a process of forming a first dielectric layer comprises a thermal oxidation growth process.

6. The method for forming a semiconductor structure according to claim 1, wherein a material of the second dielectric layer is silicon oxide.

7. The method for forming a semiconductor structure according to claim 1, wherein the step of forming a second dielectric layer in the trench on the conductor layer comprises:
   forming a second dielectric material layer in the trench on the conductor layer, an upper surface of the second dielectric material layer being higher than an upper surface of the base; and
   removing the second dielectric material layer higher than the upper surface of the base, and using the remaining material layer as the second dielectric layer.

8. The method for forming a semiconductor structure according to claim 1, wherein:
   before the step of forming a trench in the base, the method further comprises: forming a first protective layer, the first protective layer covering the base;
   the step of forming a trench in the base comprises: patterning the first protective layer and the base to form the trench; and
   before the step of the forming a drift region on a side, provided with the trench, of the base, the method further comprises: removing the first protective layer.

9. The method for forming a semiconductor structure according to claim 8, wherein a material of the first protective layer is silicon nitride.

10. The method for forming a semiconductor structure according to claim 8, wherein:
    after providing a base and before forming a first protective layer, the method further comprises:
    forming a second protective layer, the second protective layer covering the base;
    the step of forming a first protective layer, the first protective layer covering the base comprises: forming the first protective layer, the first protective layer covering the second protective layer;
    the step of the forming a trench in the base comprises: patterning the first protective layer, the second protective layer and the base to form the trench; and
    before the step of forming a drift region on a side, provided with the trench, of the base, the method further comprises:
    removing the first protective layer and the second protective layer.

11. The method for forming a semiconductor structure according to claim 10, wherein a material of the second protective layer is silicon oxide.

12. The method for forming a semiconductor structure according to claim 1, wherein the step of forming a drift region on a side, provided with the trench, of the base comprises:
    doping first-type ions in the side, provided with the trench, of the base to form the drift region.

13. The method for forming a semiconductor structure according to claim 12, further comprising:
    forming a first deep well layer and a second deep well layer under the base, where the second deep well layer is located on the first deep well layer, the first deep well layer is doped with the first-type ions, and the second deep well layer is doped with second-type ions.

14. The method for forming a semiconductor structure according to claim 13, wherein forming a first deep well layer and a second deep well layer under the base is performed before the doping first-type ions in the side, provided with the trench, of the base to form the drift region.

15. The method for forming a semiconductor structure according to claim 13, wherein the first-type ions are N-type ions, and the second-type ions are P-type ions.

16. A semiconductor structure, comprising:
a base comprising a drift region, where the base forms a trench by the drift region;
a first dielectric layer, located in the trench, and covering a bottom surface and side walls of the trench;
a conductor layer, located in the trench, and covering the first dielectric layer located on the bottom surface of the trench, a thickness of the conductor layer ranging from 10 Å to 30 Å and a thickness of the first dielectric layer between the conductor layer and the bottom surface of the trench ranges from 100 Å to 200 Å; and
a second dielectric layer, located in the trench, covering the conductor layer, and filling at least a part of the trench.

17. The semiconductor structure according to claim 16, wherein a material of the conductor layer is polysilicon.

18. The semiconductor structure according to claim 16, wherein a material of the first dielectric layer and a material of the second dielectric layer are both silicon oxide.

19. The semiconductor structure according to claim 18, wherein:
the drift region is doped with first-type ions, and
the semiconductor structure further comprises:
a first deep well layer, located under the drift region, and doped with the first-type ions; and
a second deep well layer, located under the drift region and on the first deep well layer, and doped with second-type ions.

20. The semiconductor structure according to claim 19, wherein the first-type ions are N-type ions, and the second-type ions are P-type ions.

* * * * *